(12) United States Patent
Sugiyama et al.

(10) Patent No.: US 12,236,990 B2
(45) Date of Patent: Feb. 25, 2025

(54) MAGNETIC MEMORY DEVICE

(71) Applicant: Kioxia Corporation, Tokyo (JP)

(72) Inventors: Hideyuki Sugiyama, Kawasaki Kanagawa (JP); Kenji Fukuda, Seoul (KR); Yoshiaki Asao, Kawasaki Kanagawa (JP); Kazumasa Sunouchi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 169 days.

(21) Appl. No.: 18/184,682

(22) Filed: Mar. 16, 2023

(65) Prior Publication Data

US 2023/0410868 A1 Dec. 21, 2023

(30) Foreign Application Priority Data

Jun. 21, 2022 (JP) .................. 2022-099841

(51) Int. Cl.
*G11C 11/00* (2006.01)
*G11C 11/16* (2006.01)

(52) U.S. Cl.
CPC ...... *G11C 11/1659* (2013.01); *G11C 11/1675* (2013.01)

(58) Field of Classification Search
CPC ............ G11C 11/1655; G11C 11/1657; G11C 11/1675; G11C 11/1673; G11C 11/1659; G11C 13/0069; G11C 2013/0078; G11C 11/16; G11C 11/161; G11C 11/1697; G11C 2029/5002; G11C 2213/76; G11C 29/50; G11C 29/50012; G11C 5/147; G11C 7/04; G11C 11/15; G11C 11/1693; G11C 13/0004; G11C 13/0023; G11C 13/0026; G11C 13/0028; G11C 13/003; G11C 13/004; G11C 13/0064; G11C 2213/72; G11C 7/12; G11C 11/5678; G11C 13/0002; G11C 13/0035; G11C 16/30; G11C 2213/15; G11C 2213/71

See application file for complete search history.

(56) References Cited

U.S. PATENT DOCUMENTS

| | | | |
|---|---|---|---|
| 6,169,688 B1 | 1/2001 | Noguchi | |
| 10,431,278 B2 | 10/2019 | Li et al. | |
| 11,495,278 B2 * | 11/2022 | Osada | G11C 11/1655 |
| 2005/0068830 A1 | 3/2005 | Eaton et al. | |

(Continued)

FOREIGN PATENT DOCUMENTS

| | | |
|---|---|---|
| JP | 3839958 B2 | 11/2006 |
| JP | 6107472 B2 | 3/2017 |

*Primary Examiner* — Thong Q Le
(74) *Attorney, Agent, or Firm* — Holtz, Holtz & Volek PC

(57) ABSTRACT

According to one embodiment, a magnetic memory device includes a first wiring line, a plurality of second wiring lines, a plurality of first memory cells each including a first magnetoresistance effect element and a first selector connected in series, and a first switch. A respective one of the first memory cells is connected between the first wiring line and a respective one of the second wiring lines, a first voltage is applied to the second wiring line connected to a selected first memory cell, and a second voltage is applied to the second wiring line connected to a non-selected first memory cell, a first terminal of the first switch is connected to the first wiring line, and a third voltage is applied to a second terminal of the first switch.

20 Claims, 12 Drawing Sheets

(56) References Cited

U.S. PATENT DOCUMENTS

| | | |
|---|---|---|
| 2017/0206961 A1 | 7/2017 | Yoon |
| 2019/0051341 A1 | 2/2019 | Li et al. |
| 2021/0020236 A1 | 1/2021 | Baek et al. |
| 2021/0295888 A1 | 9/2021 | Osada et al. |

* cited by examiner

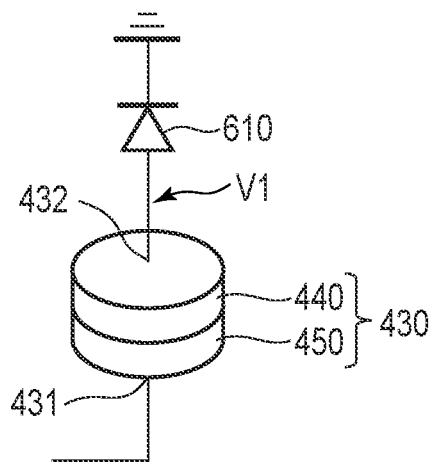
F I G. 10
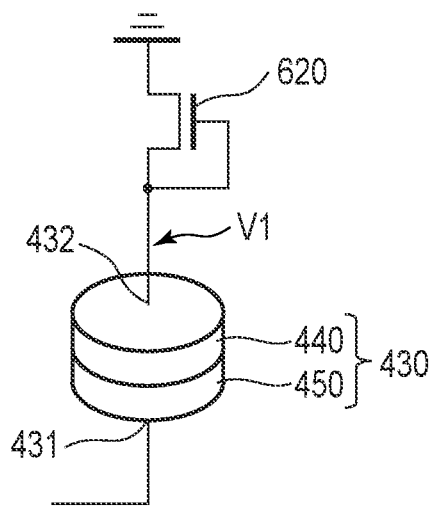
F I G. 11

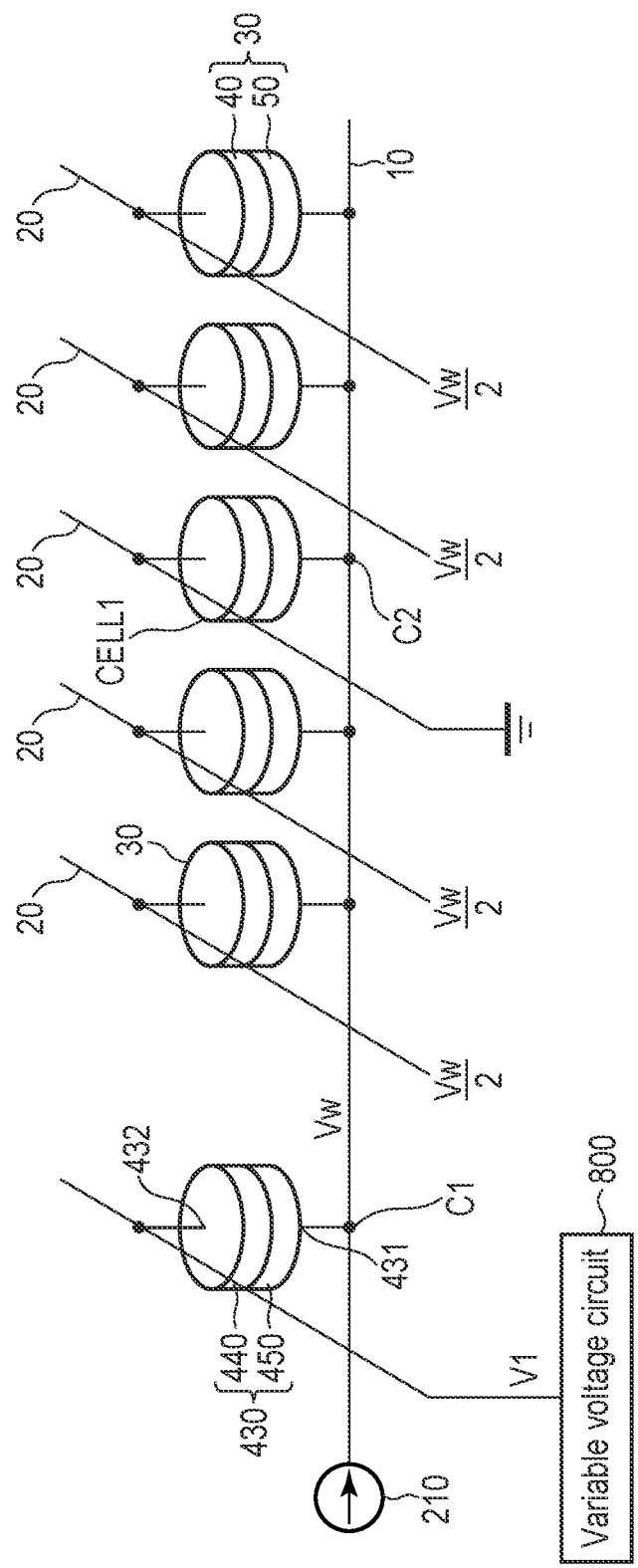
F I G. 14

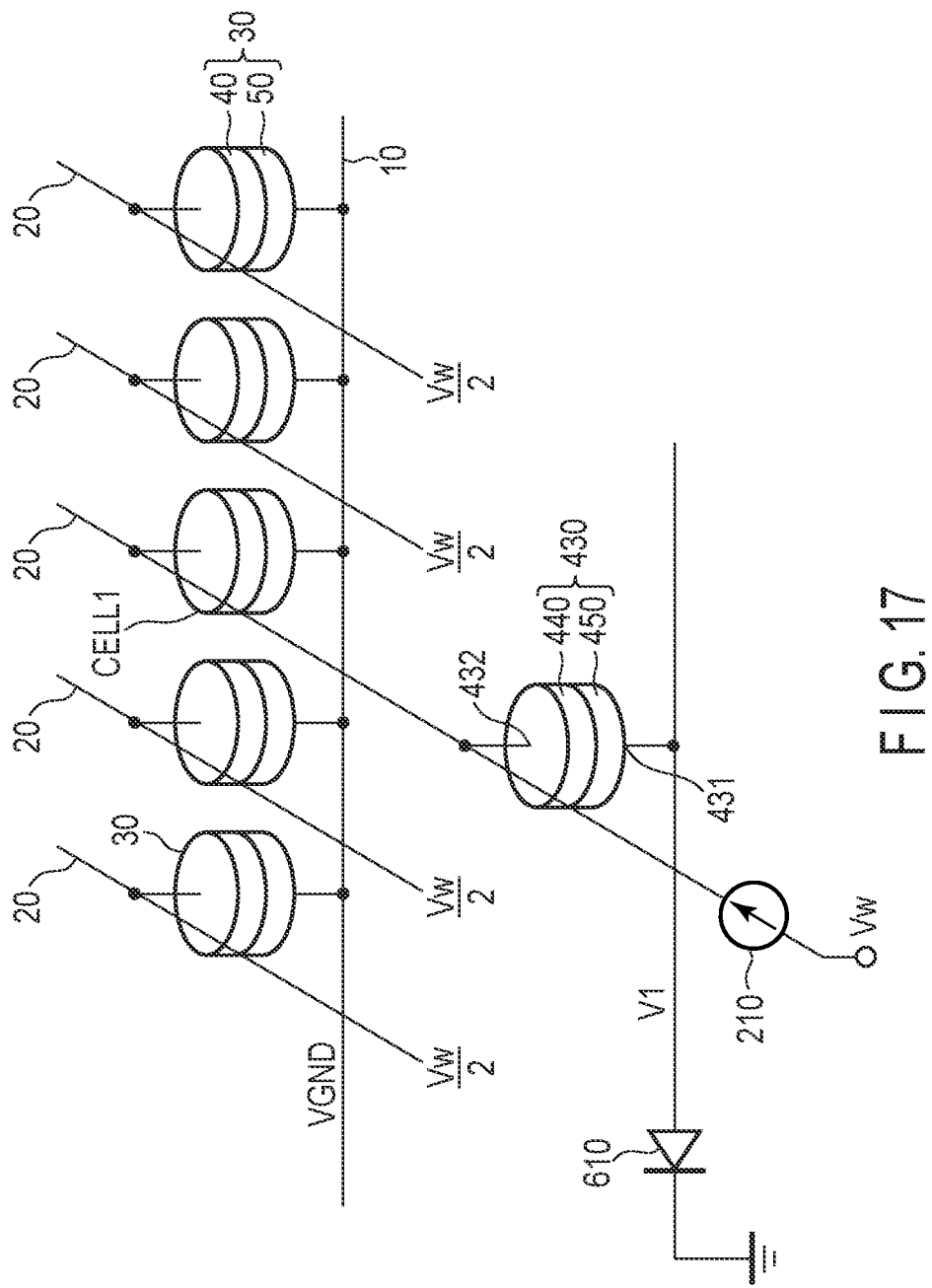
F I G. 17

MAGNETIC MEMORY DEVICE

CROSS-REFERENCE TO RELATED APPLICATIONS

This application is based upon and claims the benefit of priority from Japanese Patent Application No. 2022-099841, filed Jun. 21, 2022, the entire contents of which are incorporated herein by reference.

FIELD

Embodiments described herein relate generally to a magnetic memory device.

BACKGROUND

A magnetic memory device has been proposed in which memory cells each including a magnetoresistance effect element and a selector (switching element) are integrated on a semiconductor substrate.

BRIEF DESCRIPTION OF THE DRAWINGS

FIG. 10 is a diagram illustrating an example of a voltage generation unit of the magnetic memory device according to the embodiment.

FIG. 11 is a diagram illustrating another example of the voltage generation unit of the magnetic memory device according to the embodiment.

FIG. 14 is a diagram schematically illustrating a configuration of a magnetic memory device according to a further embodiment.

FIG. 17 is a diagram schematically illustrating a configuration of a magnetic memory device according to a further embodiment.

DETAILED DESCRIPTION

In general, according to one embodiment, a magnetic memory device includes: a first wiring line which extends in a first direction; a plurality of second wiring lines, each of which extends in a second direction intersecting the first direction; a plurality of first memory cells, each of which includes a first magnetoresistance effect element having a high resistance state and a low resistance state having a resistance lower than a resistance in the high resistance state, and a first selector connected in series to the first magnetoresistance effect element; and a first switch which includes a first terminal and a second terminal, wherein a respective one of the plurality of first memory cells is connected between the first wiring line and a respective one of the plurality of second wiring lines, a first voltage is applied to the second wiring line connected to a selected first memory cell of the first memory cells, and a second voltage is applied to the second wiring line connected to a non-selected first memory cell of the first memory cells, the first terminal of the first switch is connected to the first wiring line, and a third voltage different from the first voltage and the second voltage is applied to the second terminal of the first switch.

Hereinafter, embodiments will be described with reference to the drawings.

Figure 1:
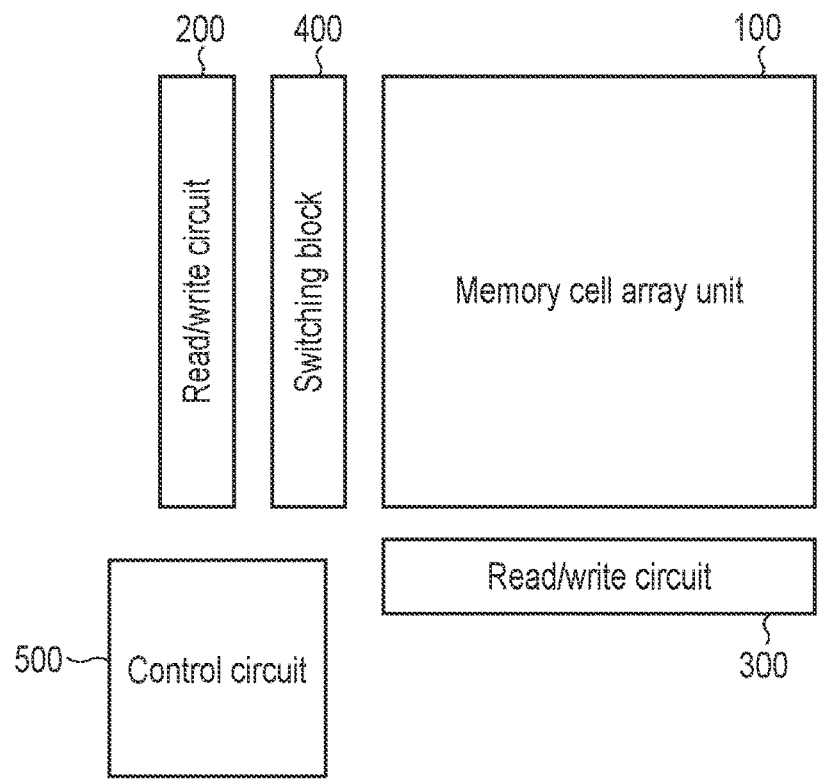
FIG. 1 is a block diagram illustrating an overall configuration of a magnetic memory device according to an embodiment.

FIG. 1 is a block diagram illustrating an overall configuration of a magnetic memory device according to an embodiment.

The magnetic memory device illustrated in FIG. 1 includes a memory cell array unit 100, a read/write circuit 200, a read/write circuit 300, a switching block 400, and a control circuit 500.

Figure 2:
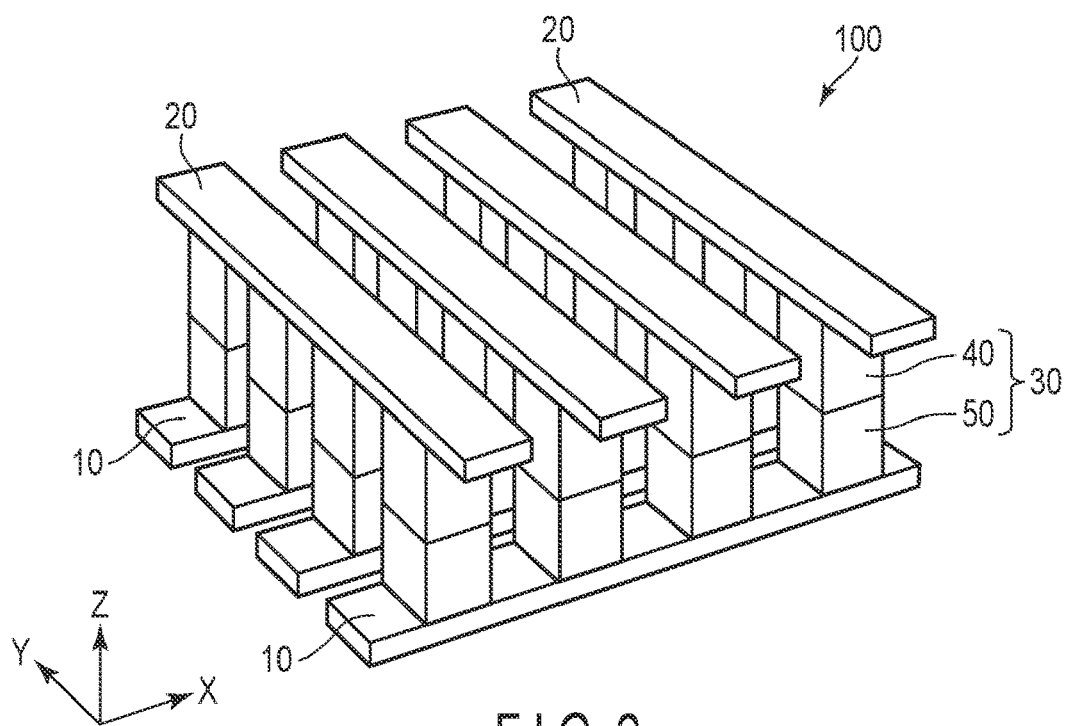
FIG. 2 is a perspective view schematically illustrating a configuration of a memory cell array unit of the magnetic memory device according to the embodiment.

FIG. 2 is a perspective view schematically illustrating a configuration of the memory cell array unit 100.

As illustrated in FIG. 2, the memory cell array unit 100 includes a plurality of wiring lines 10, a plurality of wiring lines 20, and a plurality of memory cells 30 connected between the plurality of wiring lines 10 and the plurality of wiring lines 20.

Each of the wiring lines 10 extends in an X direction, and each of the wiring lines 20 extends in a Y direction. One of the wiring line 10 and the wiring line 20 corresponds to a word line, and the other of the wiring line 10 and the wiring line 20 corresponds to a bit line.

Note that the X direction, the Y direction, and the Z direction illustrated in the drawings are directions intersecting each other. More specifically, the X direction, the Y direction, and the Z direction are orthogonal to each other.

Each of the memory cells 30 includes a magnetoresistance effect element 40 and a selector (switching element) 50 connected in series to the magnetoresistance effect element 40.

In the example illustrated in FIG. 2, the magnetoresistance effect element 40 is provided on the upper layer side, and the selector 50 is provided on the lower layer side. However, the magnetoresistance effect element 40 may be provided on the lower layer side, and the selector 50 may be provided on the upper layer side. In the present embodiment, as illustrated in FIG. 2, the magnetoresistance effect element 40 is provided on the upper layer side, and the selector 50 is provided on the lower layer side.

Figure 3:
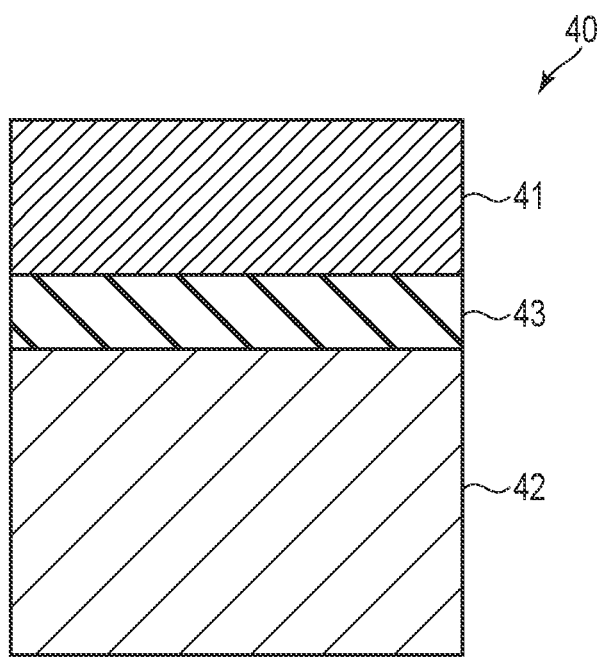
FIG. 3 is a cross-sectional view schematically illustrating a configuration of a magnetoresistance effect element of the magnetic memory device according to the embodiment.

FIG. 3 is a cross-sectional view schematically illustrating a configuration of the magnetoresistance effect element 40.

As illustrated in FIG. 3, the magnetoresistance effect element 40 is a magnetic tunnel junction (MTJ) element, and includes a storage layer (first magnetic layer) 41, a reference layer (second magnetic layer) 42, and a tunnel barrier layer (nonmagnetic layer) 43.

The storage layer 41 is a ferromagnetic layer having a variable magnetization direction. The variable magnetization direction means that the magnetization direction changes with respect to a predetermined write current flowing therethrough. The reference layer 42 is a ferromagnetic layer having a fixed magnetization direction. The fixed magnetization direction means that the magnetization direction does not change with respect to the predetermined write current flowing therethrough. The tunnel barrier layer 43 is an insulating layer provided between the storage layer 41 and the reference layer 42.

In the present embodiment, as illustrated in FIG. 3, the storage layer 41 is provided on the tunnel barrier layer 43, and the reference layer 42 is provided below the tunnel barrier layer 43. That is, the reference layer 42 is provided on the side of the wiring line 10, and the storage layer 41 is provided on the side of the wiring line 20.

When the magnetization direction of the storage layer 41 is antiparallel to the magnetization direction of the reference layer 42, the magnetoresistance effect element 40 exhibits a high resistance state. When the magnetization direction of the storage layer 41 is parallel to the magnetization direction of the reference layer 42, the magnetoresistance effect element 40 exhibits a low resistance state in which a resistance is lower than a resistance in the high resistance state.

Therefore, the magnetoresistance effect element 40 can store binary data according to its resistance state (high resistance state or low resistance state). In the magnetoresistance effect element 40, one of the high resistance state and the low resistance state can be set according to a direction of a current flowing through the magnetoresistance effect element 40.

The magnetoresistance effect element 40 is a spin transfer torque (STT) type magnetoresistance effect element and has perpendicular magnetization. That is, the magnetization direction of the storage layer 41 is perpendicular to a principal surface of the storage layer 41, and the magnetization direction of the reference layer 42 is perpendicular to a principal surface of the reference layer 42.

Figure 4:
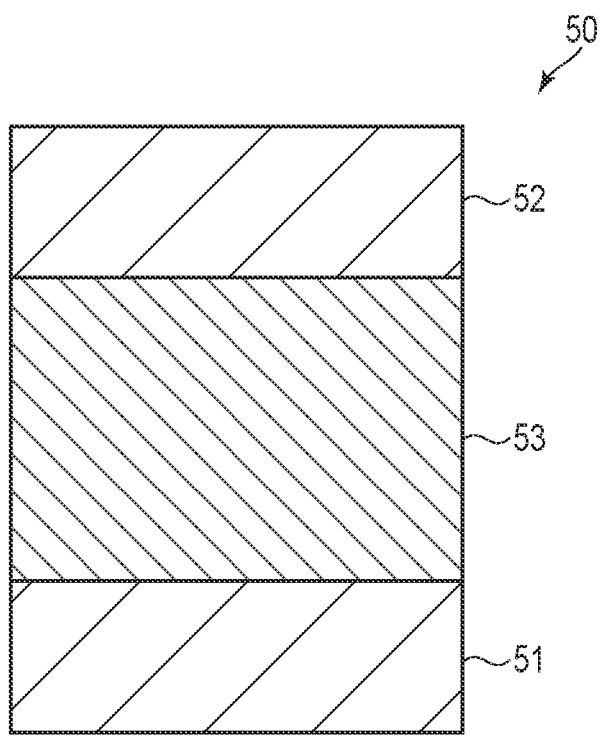
FIG. 4 is a cross-sectional view schematically illustrating a configuration of a selector of the magnetic memory device according to the embodiment.

FIG. 4 is a cross-sectional view schematically illustrating a configuration of the selector 50.

The selector 50 includes a bottom electrode 51, a top electrode 52, and a selector material layer (switching material layer) 53 provided between the bottom electrode 51 and the top electrode 52. The selector 50 is a two-terminal switching element having a non-linear current-voltage characteristic, and transitions from an off-state to an on-state when a voltage applied between the bottom electrode 51 and the top electrode 52 becomes higher than a threshold voltage.

Figure 5:
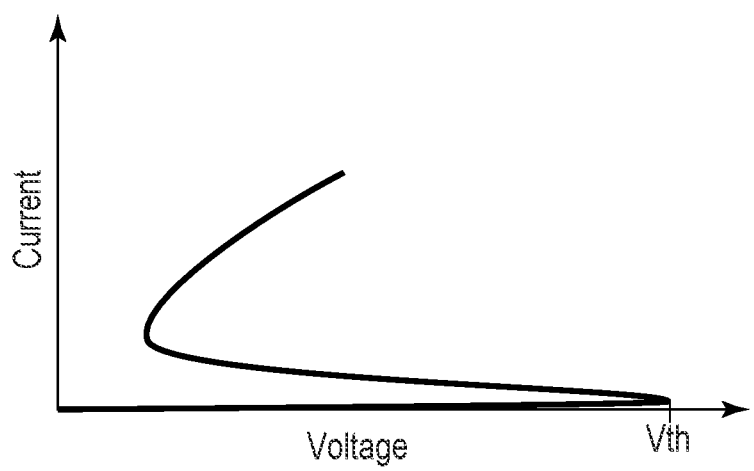
FIG. 5 is a diagram schematically illustrating a current-voltage characteristic of a memory cell of the magnetic memory device according to the embodiment.

FIG. 5 is a diagram schematically illustrating a current-voltage characteristic of the memory cell 30.

As illustrated in FIG. 5, when the voltage applied to the memory cell 30 reaches a threshold voltage Vth, the selector 50 transitions from the off-state to the on-state, and a current flows through the series connection of the magnetoresistance effect element 40 and the selector 50. Therefore, it is possible to set the high resistance state or the low resistance state to the magnetoresistance effect element 40 by applying a higher voltage than the threshold voltage Vth to the memory cell 30 and causing a current flowing through the magnetoresistance effect element 40.

Returning to the description of FIG. 1, the read/write circuits 200 and 300 perform reading and writing on the selected memory cell 30. The wiring line 10 is connected to the read/write circuit 200, and the wiring line 20 is connected to the read/write circuit 300.

The read/write circuits 200 and 300 have a function of performing a write operation selected from a first write operation and a second write operation on the selected memory cell 30. The first write operation includes an operation of writing first data to the selected memory cell 30 by setting the magnetoresistance effect element 40 included in the selected memory cell 30 to the high resistance state. The second write operation includes an operation of writing second data to the selected memory cell 30 by setting the magnetoresistance effect element 40 included in the selected memory cell 30 to the low resistance state.

The switching block 400 is provided with a plurality of switching portions (switches). As described later, each switching portion is configured by series connection of the magnetoresistance effect element and the selector (switching element).

The control circuit 500 controls operations of the read/write circuit 200, the read/write circuit 300, the switching block 400, and the like.

Figure 6:
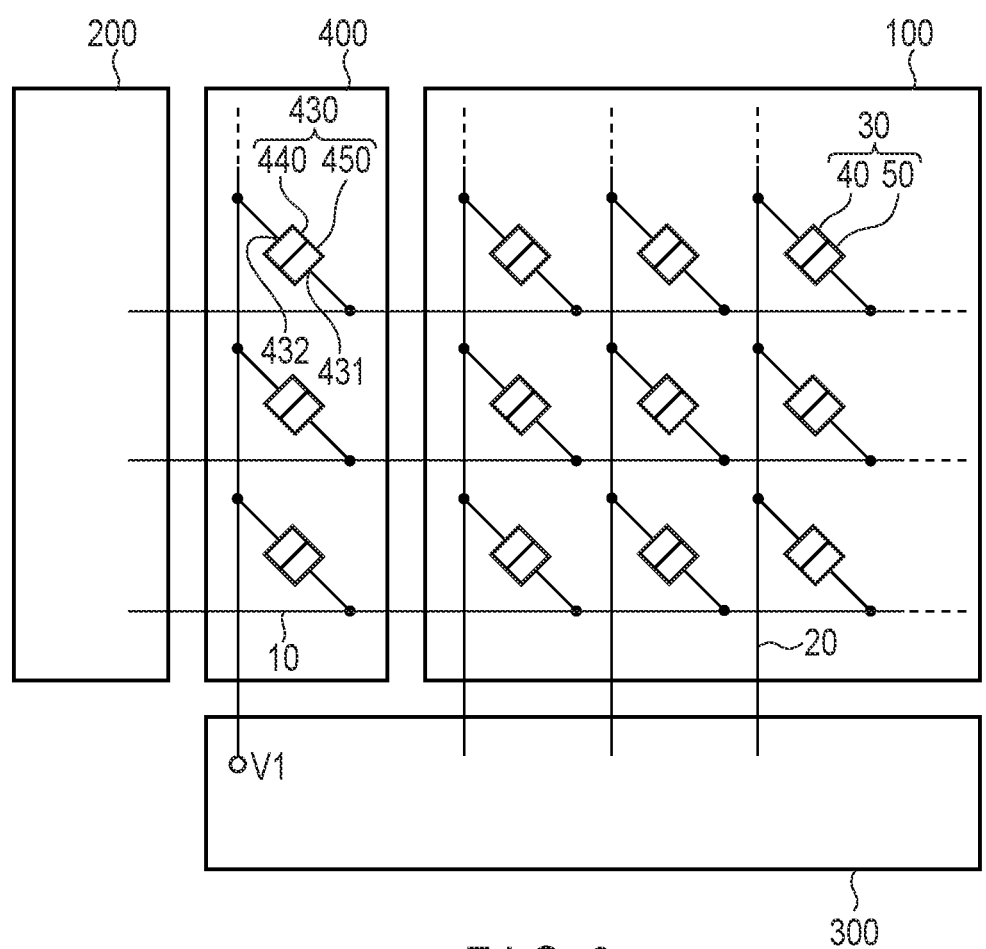
FIG. 6 is an electric circuit diagram illustrating a configuration of the memory cell array unit and a switching block of the magnetic memory device according to the embodiment.

FIG. 6 is an electric circuit diagram illustrating a configuration of the memory cell array unit 100 and the switching block 400.

As illustrated in FIG. 6, each of a plurality of switching portions 430 included in the switching block 400 is connected to the corresponding wiring line 10. Specifically, a terminal 431 of the switching portion 430 is connected to the wiring line 10, and a voltage V1 is applied to a terminal 432 of the switching portion 430.

Each switching portion 430 has substantially the same structure as the memory cell 30. That is, the switching portion 430 includes a magnetoresistance effect element 440 and a selector (switching element) 450 connected in series to the magnetoresistance effect element 440. A configuration and a function of the magnetoresistance effect element 440 are similar to the configuration and the function of the magnetoresistance effect element 40 illustrated in FIG. 3, and a configuration and a function of the selector 450 are similar to the configuration and the function of the selector 50 illustrated in FIG. 4.

The switching portion 430 is turned on when a higher voltage than a predetermined voltage (on-voltage) is applied between the terminal 431 and the terminal 432, and an on-current flows between the terminal 431 and the terminal 432.

Next, the operation of the present embodiment will be described. Hereinafter, a case where the first write operation described above is performed by the read/write circuits 200 and 300 will be described. That is, the operation of setting the magnetoresistance effect element 40 included in the selected memory cell to the high resistance state will be described.

Figure 7:
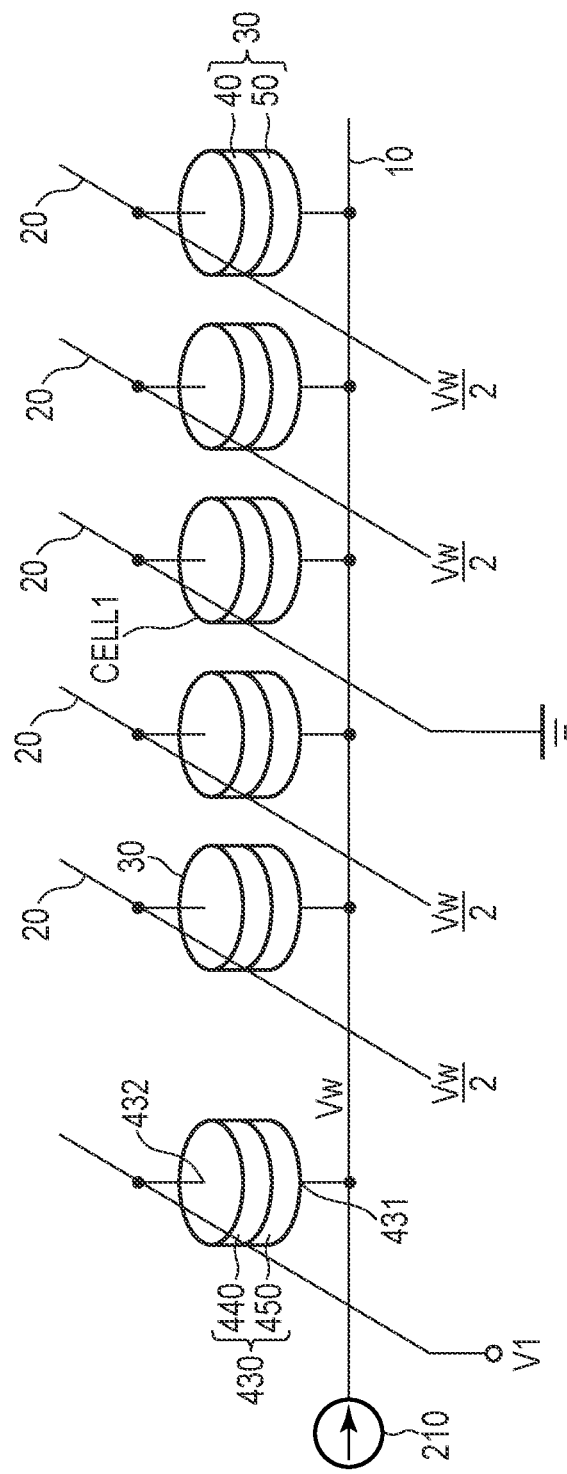
FIG. 7 is a diagram illustrating a basic operation of the magnetic memory device according to the embodiment.

FIG. 7 is a diagram illustrating a basic operation of the magnetic memory device according to the present embodiment.

FIG. 7 illustrates a state in which the selected memory cell 30 among the plurality of memory cells 30 is selected as a selected memory cell CELL1, and the first write operation is performed on the selected memory cell CELL1. That is, FIG. 7 illustrates the operation of writing the first data to the selected memory cell CELL1 (the operation of setting the high resistance state to the magnetoresistance effect element 40 included in the selected memory cell CELL1) by the read/write circuits 200 and 300.

When the read/write circuits 200 and 300 write the first data to the selected memory cell CELL1, the read/write circuits 200 and 300 apply a write voltage to the selected memory cell CELL1 to turn on the selector 50 included in the selected memory cell CELL1 and supply a write current to the magnetoresistance effect element 40 included in the selected memory cell CELL1. A specific operation is as follows.

As illustrated in FIG. 7, a voltage Vw is applied to the wiring line 10 connected to the selected memory cell CELL1, and a zero voltage (ground voltage) is applied to the wiring line 20 connected to the selected memory cell CELL1. In addition, a voltage Vw/2 is applied to the wiring lines 10 (not illustrated in the drawing) connected to the non-selected memory cells other than the selected memory cell CELL1, and the voltage Vw/2 is applied to the wiring lines 20 connected to the non-selected memory cells.

By applying the above-described voltages, the voltage Vw is applied to the selected memory cell CELL1, and the voltage Vw/2 or the zero voltage is applied to the non-selected memory cells. By setting the threshold voltage Vth (see FIG. 5) of the selector between the voltage Vw and the voltage Vw/2, only the selected memory cell CELL1 can be set to the on-state. The voltage V1 is, for example, higher than the zero voltage (ground voltage) and lower than the voltage Vw/2.

A constant-current circuit 210 is connected to the wiring line 10. The constant-current circuit 210 functions as a current supply circuit and is included in the read/write circuit 200. By setting the selected memory cell CELL1 to the on-state, the write current is supplied from the constant-current circuit 210 to the selected memory cell CELL1 via the wiring line 10, and writing is performed to the selected memory cell CELL1.

When the write current is supplied to the selected memory cell CELL1 and the magnetoresistance effect element 40 included in the selected memory cell CELL1 is set to the high resistance state, a high voltage is applied to the selected memory cell CELL1. That is, when the write current supplied to the selected memory cell CELL1 is set to Iw and the resistance of the magnetoresistance effect element 40 in the high resistance state is set to Rh, a voltage (Iw×Rh) is applied to the magnetoresistance effect element 40 in the selected memory cell CELL1.

Ideally, the plurality of memory cells 30 included in the same chip preferably have the same size (the same area). However, there is a case where the memory cell 30 having a small size (area) is formed due to variations in lithography or the like. The magnetoresistance effect element 40 included in the memory cell 30 having such a small size has a relatively high resistance. Therefore, in a case where the memory cell 30 having a small size is selected as the selected memory cell CELL1, when the high resistance state is set to the magnetoresistance effect element 40 included in the selected memory cell CELL1, an excessive voltage being higher than an allowable voltage may be applied to the selected memory cell CELL1. As a result, endurance of the magnetoresistance effect element 40 may be deteriorated.

In the present embodiment, the switching portion 430 is connected substantially in parallel to the selected memory cell CELL1. Therefore, when a high voltage is applied to the selected memory cell CELL1, the switching portion 430 is turned on. Specifically, in a case where the write current is supplied to the selected memory cell CELL1, when a voltage being higher than a predetermined voltage Vth0 is applied to the switching portion 430 connected to the wiring line 10 to which the selected memory cell CELL1 is connected, that is, when a voltage (Vth0+V1) is applied to the wiring line 10, the switching portion 430 is turned on. The predetermined voltage Vth0 corresponds to the threshold voltage of the switching portion 430, and basically has substantially the same value as the threshold voltage Vth of the memory cell 30 illustrated in FIG. 5.

When the switching portion 430 is turned on, a part of the current supplied from the constant-current circuit 210 flows through the switching portion 430. Therefore, the current flowing through the selected memory cell CELL1 decreases, and the voltage applied to the selected memory cell CELL1 also decreases. As a result, it is possible to suppress application of an excessive voltage to the selected memory cell CELL1.

Figure 8:
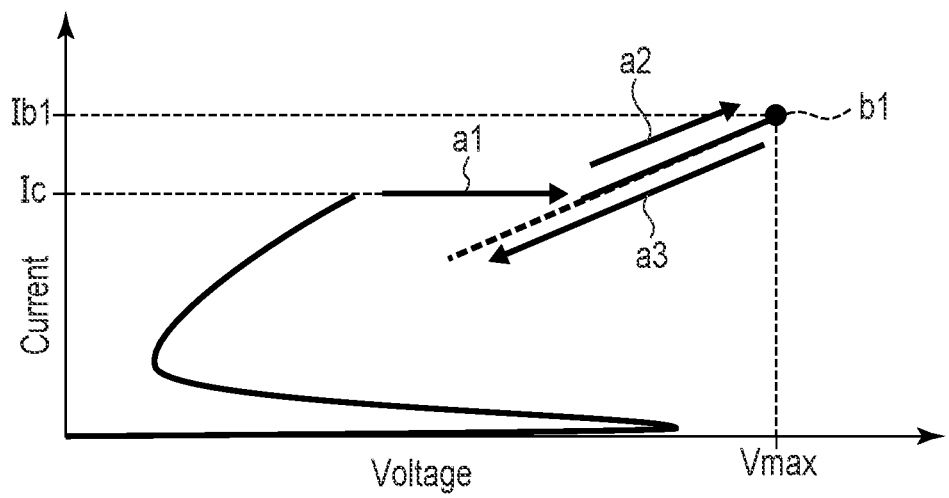
FIG. 8 is a diagram schematically illustrating a relationship between a voltage applied to a selected memory cell and a current flowing through the selected memory cell in a case where the magnetoresistance effect element included in the selected memory cell transitions from a low resistance state to a high resistance state in the magnetic memory device according to the embodiment.

FIG. 8 is a diagram schematically illustrating a relationship between a voltage applied to the selected memory cell CELL1 and a current flowing through the selected memory cell CELL1 when the magnetoresistance effect element 40 included in the selected memory cell CELL1 transitions from the low resistance state to the high resistance state.

Figure 9:
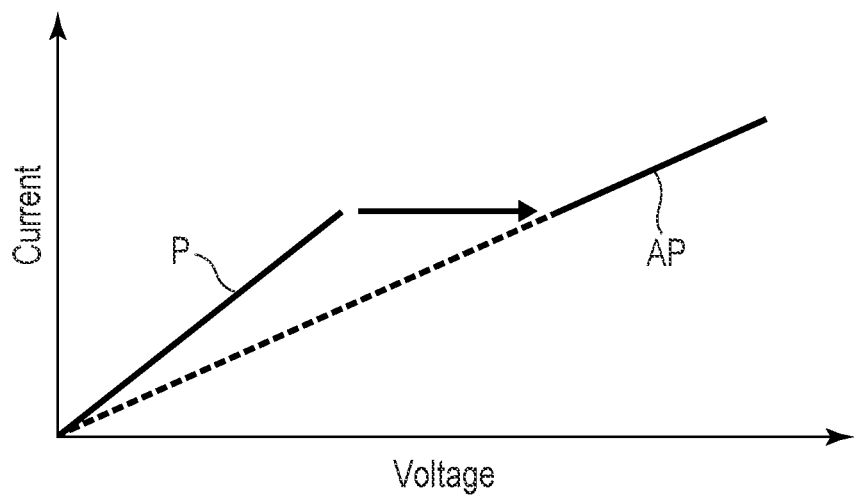
FIG. 9 is a diagram schematically illustrating a relationship between a voltage applied to the magnetoresistance effect element and a current flowing through the magnetoresistance effect element in a case where the magnetoresistance effect element transitions from a low resistance state to a high resistance state in the magnetic memory device according to the embodiment.

FIG. 9 is a diagram schematically illustrating a relationship between a voltage applied to the magnetoresistance effect element 40 and a current flowing through the magnetoresistance effect element 40 when the magnetoresistance effect element 40 transitions from the low resistance state to the high resistance state.

When the write current flows through the magnetoresistance effect element 40 and the magnetoresistance effect element 40 transitions from the low resistance state to the high resistance state, the current-voltage characteristic of the magnetoresistance effect element 40 transitions from a state P to a state AP as shown in FIG. 9. Therefore, when the magnetoresistance effect element 40 transitions from the low resistance state to the high resistance state, the voltage applied to the selected memory cell CELL1 increases as indicated by an arrow a1 in FIG. 8. As indicated by an arrow a2 in FIG. 8, when the voltage is further increased and the voltage applied to the selected memory cell CELL1 becomes Vmax, the switching portion 430 connected in substantially parallel to the selected memory cell CELL1 transitions to the on-state (corresponding to a point b1 in FIG. 8). A value of Vmax is the sum of the voltage V1 and the threshold voltage (predetermined voltage Vth0) of the switching portion 430 (Vmax=V1+Vth0). That is, when a higher voltage than the predetermined voltage Vth0 is applied to the switching portion 430, the switching portion 430 transitions to the on-state. Therefore, a part of a constant current Ic supplied from the constant-current circuit 210 flows through the switching portion 430. As a result, as indicated by an arrow a3 in FIG. 8, the current flowing through the selected memory cell CELL1 decreases, and the voltage applied to the selected memory cell CELL1 also decreases. Note that the value of Vmax is a value larger than an average value of the threshold voltages Vth of the selectors 50 of the plurality of memory cells 30 connected to the wiring line 10 to which the selected memory cell CELL1 is connected. A value of the voltage V1 is, for example, a value that is three times or more a variation in the threshold voltage Vth of each selector 50 of the plurality of memory cells 30 connected to the wiring line 10 to which the selected memory cell CELL1 is connected.

As described above, in the present embodiment, by providing the switching portion 430, it is possible to suppress application of an excessive voltage to the selected memory cell CELL1. In particular, when the selected memory cell CELL1 is set to the high resistance state, it is possible to effectively suppress application of an excessive voltage to the selected memory cell CELL1. As a result, in the present embodiment, the endurance of the magnetoresistance effect element 40 can be improved.

In the present embodiment, since the switching portion 430 has substantially the same structure as the memory cell 30, the switching portion 430 can be formed in a process common to the memory cell 30. Therefore, it is possible to suppress an increase in the manufacturing process due to the formation of the switching portion 430.

When the switching portion 430 is turned on before the magnetoresistance effect element 40 included in the selected memory cell CELL1 is set to the high resistance state, there is a possibility that a current necessary for setting the magnetoresistance effect element 40 to the high resistance state cannot be supplied to the magnetoresistance effect element 40.

Therefore, in order to accurately perform the operation described above, it is preferable that after the write current is applied to the selected memory cell CELL1 and the magnetoresistance effect element 40 included in the selected memory cell CELL1 is set to the high resistance state, a higher voltage than the predetermined voltage Vth0 is applied to the switching portion 430, so that the switching portion 430 is turned on. In the present embodiment, as described below, such an operation can be accurately performed.

The voltage V1 (V1>0) is applied to the terminal 432 of the switching portion 430. In addition, the zero voltage (ground voltage) is applied to the wiring line 20 connected to the selected memory cell CELL1. Therefore, when data is written to the selected memory cell CELL1, the voltage applied to the switching portion 430 connected to the wiring line 10 to which the selected memory cell CELL1 is connected is lower than the voltage applied to the selected memory cell CELL1. Therefore, by setting the voltage V1 to an appropriate value, it is possible to prevent the switching portion 430 from being turned on when the selected memory cell CELL1 is turned on.

As described above, in the present embodiment, it is possible to cause the switching portion 430 to appropriately transition to the on-state after the magnetoresistance effect element 40 is set to the high resistance state.

In the present embodiment, the appropriate voltage V1 is applied to the terminal 432 of the switching portion 430. However, the voltage V1 may be applied to the terminal 432 of the switching portion 430 using a circuit or an element that generates a voltage drop.

FIG. 10 is a diagram illustrating an example of a voltage generation unit for applying the voltage V1 to the terminal 432 of the switching portion 430. As illustrated in FIG. 10, a diode 610 is connected to the terminal 432 of the switching portion 430 as the voltage generation unit, and the voltage V1 is applied to the terminal 432 based on a voltage drop generated by the diode 610. That is, the voltage V1 is applied to the terminal 432 based on a forward bias voltage of the diode 610. In a case where the diode 610 is used as the voltage generation unit, since the voltage V1 is determined by a physical property value, a variation in the voltage V1 can be reduced.

FIG. 11 is a diagram illustrating another example of the voltage generation unit for applying the voltage V1 to the terminal 432 of the switching portion 430. As illustrated in FIG. 11, a transistor (NMOS transistor) 620 having diode connection as the voltage generation unit is connected to the terminal 432 of the switching portion 430, and the voltage V1 is applied to the terminal 432 based on a voltage drop generated in the transistor 620. That is, the voltage V1 is applied to the terminal 432 based on a threshold voltage of the transistor 620 having the diode connection. When the transistor 620 is used as the voltage generation unit, the voltage V1 can be adjusted by the impurity concentration.

Note that a configuration other than the voltage generation unit illustrated in FIGS. 10 and 11 can be used as long as the appropriate voltage V1 can be set.

Next, a further embodiment will be described.

Figure 12:
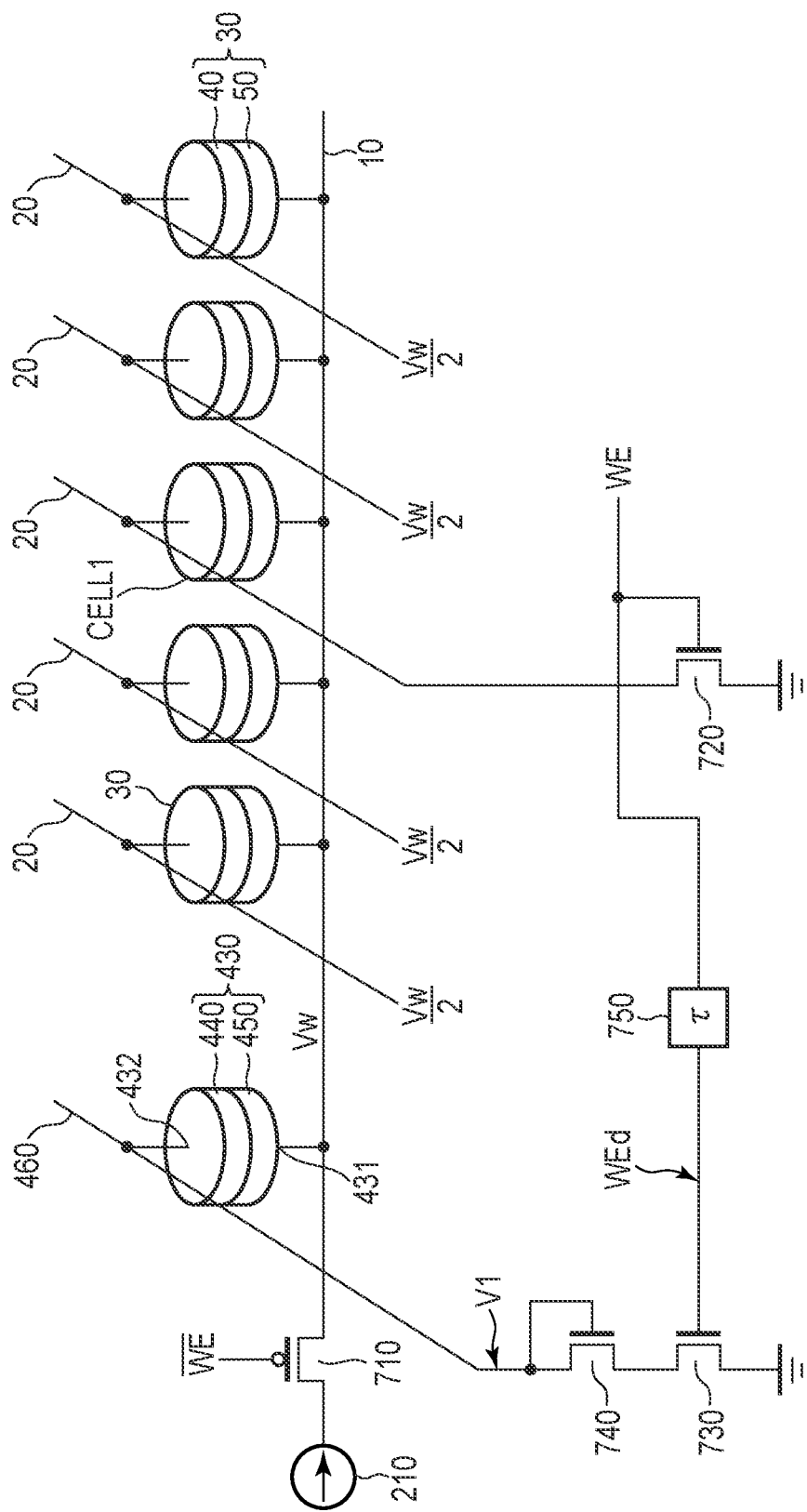
FIG. 12 is a diagram illustrating a basic operation of a magnetic memory device according to a further embodiment.

FIG. 12 is a diagram illustrating a basic operation of a magnetic memory device according to the further embodiment.

In this embodiment, in addition to the configuration illustrated in FIG. 7, an enable transistor (PMOS transistor) 710, an enable transistor (NMOS transistor) 720, an enable transistor (NMOS transistor) 730, a diode connection transistor (NMOS transistor) 740, and a delay circuit 750 are further included.

The enable transistor 710 is included in the read/write circuit 200, and the enable transistor 720, the enable transistor 730, and the diode connection transistor 740 are included in the read/write circuit 300.

The enable transistor 710 is connected to the wiring line 10, and when the enable transistor 710 is turned on by an inverted write enable signal/WE, the wiring line 10 becomes an active state. The enable transistor 720 is connected to the wiring line 20, and when the enable transistor 720 is turned on by a write enable signal WE, the wiring line 20 becomes an active state.

When the enable transistor 710 connected to the selected memory cell CELL1 is set to the on-state, the voltage Vw is applied to one terminal of the selected memory cell CELL1. When the enable transistor 720 connected to the selected memory cell CELL1 is set to the on-state, the zero voltage (ground voltage) is applied to the other terminal of the selected memory cell CELL1. As a result, data can be written to the selected memory cell CELL1.

The write enable signal WE is delayed by the delay circuit 750, and a delayed write enable signal WEd is input to the enable transistor 730. When the enable transistor 730 is turned on by the delayed write enable signal WEd, a wiring line 460 connected to the switching portion 430 becomes an active state.

When the enable transistor 730 connected to the switching portion 430 is set to the on-state, the voltage V1 is applied to the second terminal 432 of the switching portion 430. As a result, the switching portion 430 can transition to the on-state.

As can be seen from the above description, the enable transistors 710 and 720 have a function of generating a state (first enable state) in which data can be written to the selected memory cell CELL1. Each of the enable transistors 710 and 720 is an example of a first element. The enable transistor 730 has a function of generating a state (second enable state) in which the switching portion 430 can be turned on. The enable transistor 730 is an example of a second element. In addition, the delay circuit 750 has a function of generating a delay time τ from the generation of the first enable state to the generation of the second enable state.

As can be seen from the above description, in this embodiment, by providing the delay circuit 750, the enable transistor 730 is turned on after a predetermined time (delay time τ) has elapsed since the enable transistor 720 is turned on. Therefore, after data is reliably written to the selected memory cell CELL1, the switching portion 430 can be turned on.

As described above, in order to reliably write the first data (data in which the magnetoresistance effect element 40 is set to the high resistance state) to the selected memory cell CELL1, it is preferable that, after the magnetoresistance effect element 40 included in the selected memory cell CELL1 is set to the high resistance state, a higher voltage than the predetermined voltage Vth0 is applied to the switching portion 430, so that the switching portion 430 is turned on.

In this embodiment, by providing the delay circuit 750, the switching portion 430 can be turned on after data is reliably written to the selected memory cell CELL1.

Figure 13:
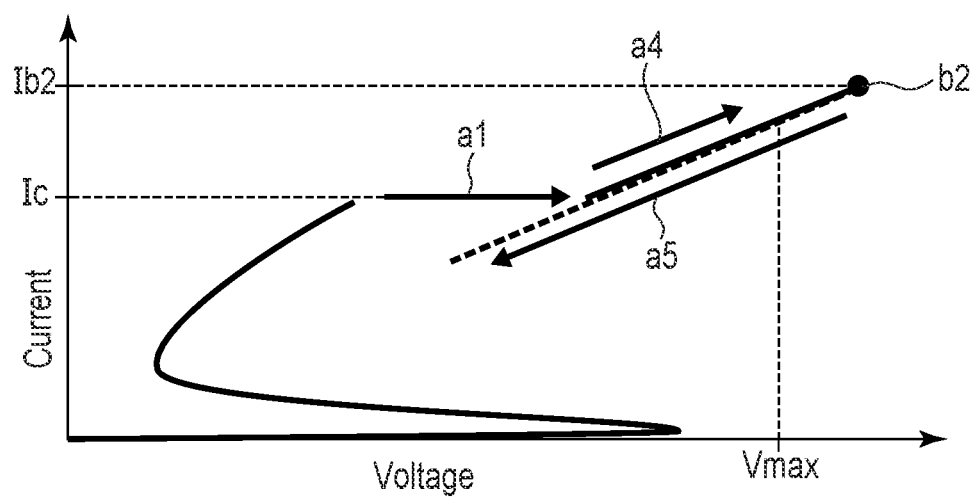
FIG. 13 is a diagram schematically illustrating a relationship between a voltage applied to a selected memory cell and a current flowing through the selected memory cell in a case where a magnetoresistance effect element included in the selected memory cell transitions from a low resistance state to a high resistance state in the further embodiment.

FIG. 13 is a diagram schematically illustrating a relationship between a voltage applied to the selected memory cell CELL1 and a current flowing through the selected memory cell CELL1 when the magnetoresistance effect element 40 included in the selected memory cell CELL1 transitions from the low resistance state to the high resistance state, in this embodiment.

When the memory cell 30 having a relatively high resistance and a small size is selected as the selected memory cell CELL1, as indicated by an arrow a4 in FIG. 13, even if the voltage applied to the selected memory cell CELL1 becomes higher than Vmax, the switching portion 430 is not turned on and transitions to a higher voltage than Vmax (corresponding to a point b2). Therefore, a voltage higher than Vmax may be applied to the selected memory cell CELL1.

In this embodiment, by appropriately setting the delay time τ generated by the delay circuit 750, the switching portion 430 can transition to the on-state after the selector 50 of the selected memory cell CELL1 is turned on. When the switching portion 430 is turned on, the voltage applied to the selected memory cell CELL1 decreases as indicated by an arrow a5 in FIG. 13. As described above, by appropriately setting the delay time τ generated by the delay circuit 750, the time for which a higher voltage than Vmax is applied to the selected memory cell CELL1 can be shortened, and it is possible to prevent a high voltage from being applied to the selected memory cell CELL1 for a long time. Therefore, even in this embodiment, the endurance of the magnetoresistance effect element can be improved.

Next, a further embodiment will be described.

FIG. 14 is a diagram schematically illustrating a configuration of a magnetic memory device according to this embodiment.

As illustrated in FIG. 14, in this embodiment, a variable voltage circuit 800 is connected to the switching portion 430. That is, in this embodiment, as described below, the voltage V1 applied to the terminal 432 of the switching portion 430 is variable.

As illustrated in FIG. 14, the switching portion 430 is provided between the memory cell 30 and the constant-current circuit 210. That is, a connection point C1 between the switching portion 430 and the wiring line 10 is located between a connection point C2 between the selected memory cell CELL1 and the wiring line 10 and the constant-current circuit 210.

Ideally, a resistance value of the wiring line 10 is preferably 0, but actually, the resistance value of the wiring line 10 is not 0. Therefore, when a current is supplied from the constant-current circuit 210 to the wiring line 10, a voltage drop is generated due to the wiring line 10. An amount of voltage drop increases as the distance from the constant-current circuit 210 increases. For this reason, assuming that the voltage V1 is constant when the write current flows through the selected memory cell CELL1, the voltage applied to the switching portion 430 increases as the position of the selected memory cell CELL1 becomes farther from the constant-current circuit 210.

Therefore, in this embodiment, the variable voltage circuit 800 is provided so that the voltage V1 is variable according to the position of the selected memory cell CELL1 (that is, according to the position of the connection point C2). Specifically, the variable voltage circuit 800 adjusts the voltage V1 to increase as the position of the selected memory cell CELL1 becomes farther from the constant-current circuit 210.

As described above, in this embodiment, the voltage V1 is variable according to the position of the selected memory cell CELL1. For this reason, regardless of the position of the selected memory cell CELL1, the voltage applied to the switching portion 430 can be set to a constant value. Therefore, the operation of the above-described embodiment can be performed more accurately.

Figure 15:
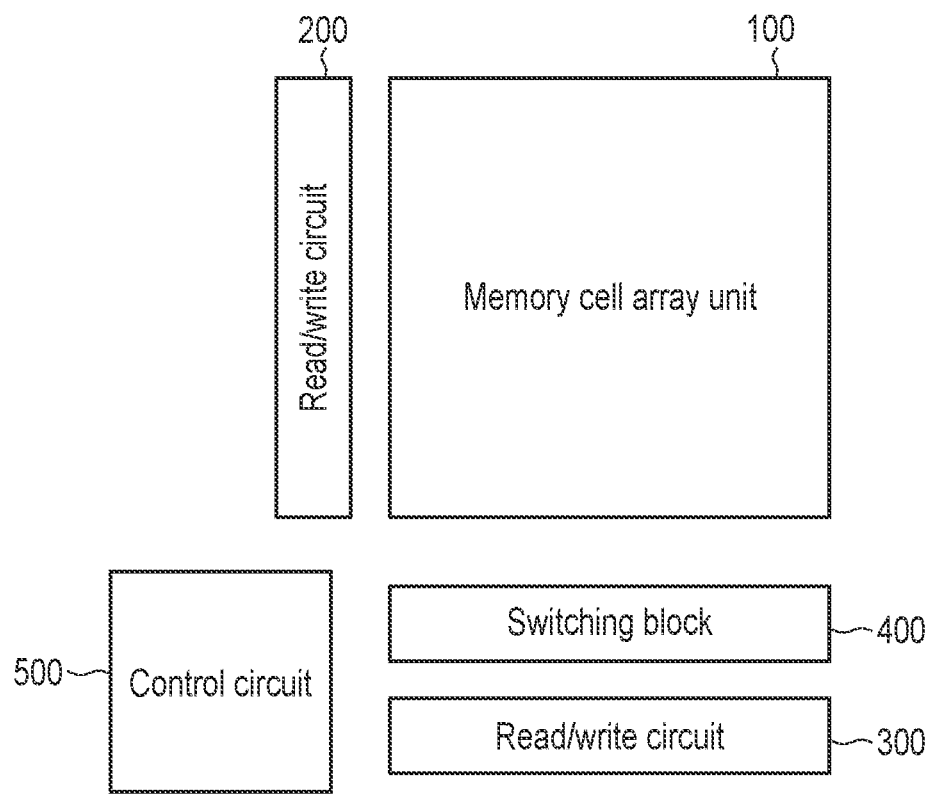
FIG. 15 is a block diagram illustrating an overall configuration of a magnetic memory device according to a further embodiment.
Figure 16:
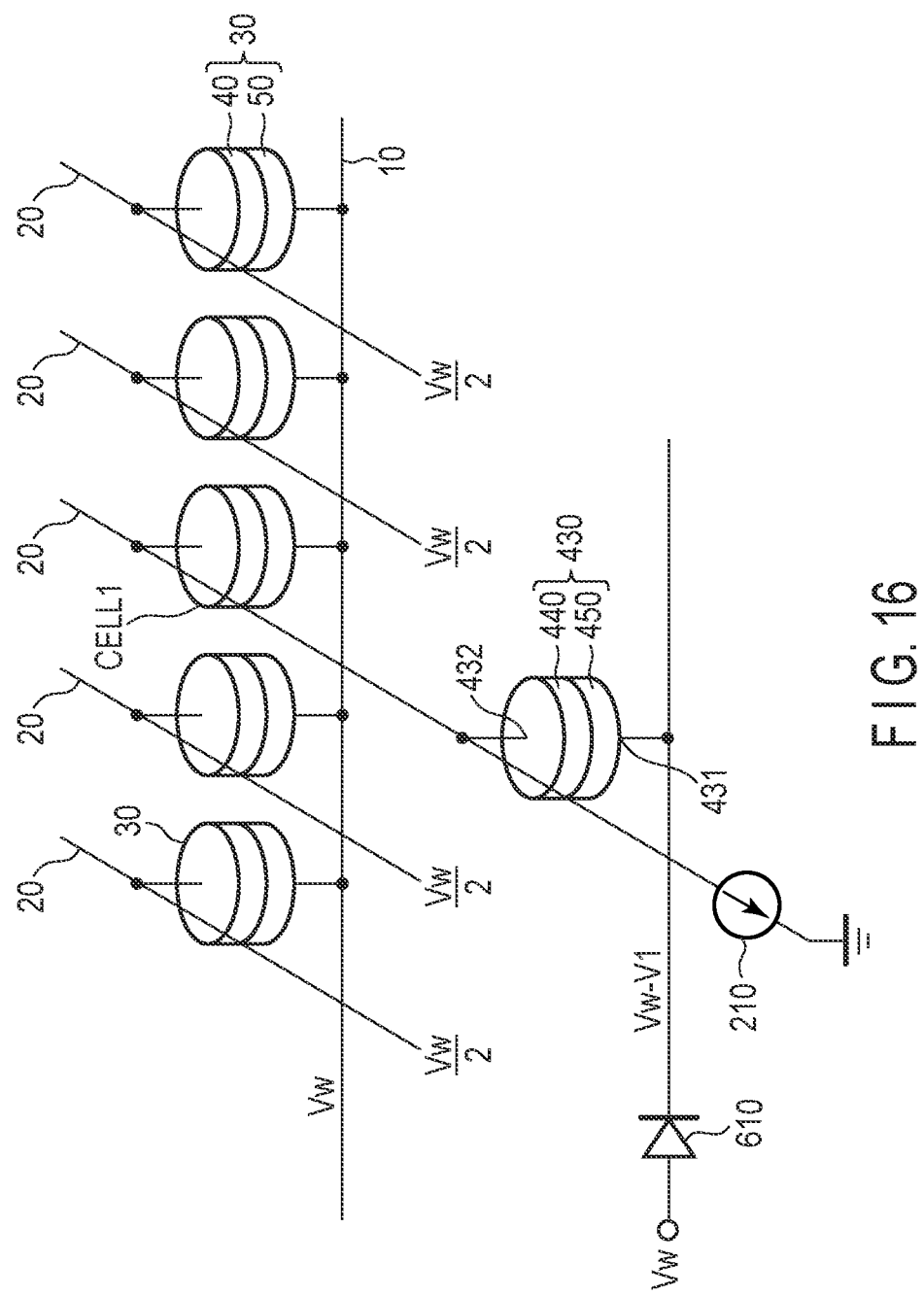
FIG. 16 is a diagram schematically illustrating a configuration of the magnetic memory device according to the further embodiment.

FIG. 15 is a block diagram illustrating an overall configuration of a magnetic memory device according to a further embodiment. FIG. 16 is a diagram schematically illustrating a configuration of the magnetic memory device according to this embodiment.

As illustrated in FIG. 15, in this embodiment, the switching block 400 including the plurality of switching portions 430 is provided on the side of the read/write circuit 300, and the constant-current circuit 210 is provided in the read/write circuit 300.

As illustrated in FIG. 16, in this embodiment, the switching portion 430 and the constant-current circuit 210 are connected to the wiring line 20. Although only the switching portion 430 and the constant-current circuit 210 connected to the wiring line 20 connected to the selected memory cell CELL1 are illustrated in FIG. 16, the switching portion 430 and the constant-current circuit 210 are similarly connected to the other wiring lines 20.

A basic operation of this embodiment is similar to the operation described with reference to FIG. 7. Hereinafter, similarly to the case of FIG. 7, an operation of writing the first data to the selected memory cell CELL1 (an operation of setting the high resistance state to the magnetoresistance effect element 40 included in the selected memory cell CELL1) will be described.

When the memory cell CELL1 is selected, the voltage Vw is applied to the wiring line 10 connected to the selected memory cell CELL1, and the zero voltage (ground voltage VGND) is applied to the wiring line 20 connected to the selected memory cell CELL1. In addition, a voltage Vw/2 is applied to the wiring lines (not illustrated in the drawing) connected to the non-selected memory cells other than the selected memory cell CELL1, and the voltage Vw/2 is applied to the wiring lines 20 connected to the non-selected memory cells. By applying the above-described voltages, the voltage Vw is applied to the selected memory cell CELL1, and the voltage Vw/2 or the zero voltage is applied to the non-selected memory cells. As a result, only the selected memory cell CELL1 is set to the on-state.

The constant-current circuit 210 is connected to the wiring line 20, and when the selected memory cell CELL1 is set to the on-state, a write current is supplied to the selected memory cell CELL1. When the write current is supplied to the selected memory cell CELL1 and the magnetoresistance effect element 40 included in the selected memory cell CELL1 is set to the high resistance state, a high voltage is applied to the selected memory cell CELL1. As a result, the switching portion 430 connected to the same wiring line as the selected memory cell CELL1 is turned on. In this embodiment, a voltage (Vw−V1) is applied to the terminal 431 of the switching portion 430. Therefore, when a voltage (Vw−V1−Vth0) is applied to the terminal 432 of the switching portion 430, the threshold voltage Vth0 is applied to the switching portion 430, and the switching portion 430 is turned on.

When the switching portion 430 is turned on, a part of the current of the constant-current circuit 210 flows through the switching portion 430. Therefore, the current flowing through the selected memory cell CELL1 decreases, and the voltage applied to the selected memory cell CELL1 also decreases. As a result, it is possible to suppress application of an excessive voltage to the selected memory cell CELL1.

FIG. 17 is a diagram schematically illustrating a configuration of a magnetic memory device according to a further embodiment. An overall configuration of the magnetic memory device of this embodiment is represented similarly to the block diagram illustrated in FIG. 15 of the further embodiment. That is, the switching block 400 including the plurality of switching portions 430 is provided on the side of the read/write circuit 300, and the constant-current circuit 210 is provided in the read/write circuit 300.

In the magnetoresistance effect element 40 of the above-described embodiment, as illustrated in FIG. 3, the storage layer 41 is provided on the tunnel barrier layer 43, and the reference layer 42 is provided below the tunnel barrier layer 43. In the magnetoresistance effect element 40 of this embodiment, the storage layer 41 is provided below the tunnel barrier layer 43, and the reference layer 42 is provided on the tunnel barrier layer 43. Therefore, in this embodiment, even in the magnetoresistance effect element 440 included in the switching portion 430, the storage layer is provided below the tunnel barrier layer, and the reference layer is provided on the tunnel barrier layer.

A basic operation of this embodiment is similar to the operation described with reference to FIG. 7. Hereinafter, similarly to the case of FIG. 7, an operation of writing the first data to the selected memory cell CELL1 (an operation of setting the high resistance state to the magnetoresistance effect element 40 included in the selected memory cell CELL1) will be described.

When the memory cell CELL1 is selected, the zero voltage (ground voltage VGND) is applied to the wiring line 10 connected to the selected memory cell CELL1, and the voltage Vw is applied to the wiring line connected to the selected memory cell CELL1. In addition, a voltage Vw/2 is applied to the wiring lines (not illustrated in the drawing) connected to the non-selected memory cells other than the selected memory cell CELL1, and the voltage Vw/2 is applied to the wiring lines 20 connected to the non-selected memory cells. By applying the above-described voltages, the voltage Vw is applied to the selected memory cell CELL1, and the voltage Vw/2 or the zero voltage is applied to the non-selected memory cells. As a result, only the selected memory cell CELL1 is set to the on-state.

The constant-current circuit 210 is connected to the wiring line 20, and when the selected memory cell CELL1 is set to the on-state, a write current is supplied to the selected memory cell CELL1. When the write current is supplied to the selected memory cell CELL1 and the magnetoresistance effect element 40 included in the selected memory cell CELL1 is set to the high resistance state, a high voltage is applied to the selected memory cell CELL1. As a result, the switching portion 430 connected to the same wiring line as the selected memory cell CELL1 is turned on. In this embodiment, the voltage V1 is applied to the terminal 431 of the switching portion 430. Therefore, when the voltage (V1+Vth0) is applied to the terminal 432 of the switching portion 430, the threshold voltage Vth0 is applied to the switching portion 430, and the switching portion 430 is turned on.

When the switching portion 430 is turned on, a part of the current of the constant-current circuit 210 flows through the switching portion 430. Therefore, the current flowing through the selected memory cell CELL1 decreases, and the voltage applied to the selected memory cell CELL1 also decreases. As a result, it is possible to suppress application of an excessive voltage to the selected memory cell CELL1.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A magnetic memory device comprising:
   a first wiring line which extends in a first direction;
   a plurality of second wiring lines, each of which extends in a second direction intersecting the first direction;
   a plurality of first memory cells, each of which includes a first magnetoresistance effect element capable of setting a high resistance state or a low resistance state in which a resistance is lower than a resistance in the high resistance state, and a first selector connected in series to the first magnetoresistance effect element; and
   a first switch which includes a first terminal and a second terminal,
   wherein
   a respective one of the plurality of first memory cells is connected between the first wiring line and a respective one of the plurality of second wiring lines,
   the magnetic memory device is configured to apply in operation a first voltage to the second wiring line connected to a selected first memory cell of the plurality of first memory cells, and a second voltage is applied to the second wiring line connected to a non-selected first memory cell of the plurality of first memory cells, the first terminal of the first switch is connected to the first wiring line, and the magnetic memory device is configured to apply in operation a third voltage different from the first voltage and the second voltage to the second terminal of the first switch.

2. The magnetic memory device according to claim 1, wherein the third voltage is higher than the first voltage and is lower than the second voltage.

3. The magnetic memory device according to claim 1, wherein the third voltage is higher than the second voltage and is lower than the first voltage.

4. The magnetic memory device according to claim 1, further comprising:

a third wiring line which extends in the first direction;

a plurality of second memory cells, each of which includes a second magnetoresistance effect element capable of setting a high resistance state or a low resistance state in which a resistance is lower than a resistance in the high resistance state, and a second selector connected in series to the second magnetoresistance effect element; and a second switch which includes a third terminal and a fourth terminal, wherein a respective one of the plurality of the second memory cells is connected between the third wiring line and a respective one of the plurality of second wiring lines, the third terminal of the second switch is connected to the third wiring line, and a respective one of the plurality of first memory cells and a respective one of the plurality of second memory cells are commonly connected to a respective one of the plurality of second wiring lines.

5. The magnetic memory device according to claim 1, wherein the first switch includes a third magnetoresistance effect element and a third selector connected in series to the third magnetoresistance effect element.

6. The magnetic memory device according to claim 4, wherein the second switch includes a fourth magnetoresistance effect element and a fourth selector connected in series to the fourth magnetoresistance effect element.

7. The magnetic memory device according to claim 1, wherein the first switch has the same structure as the first memory cell.

8. The magnetic memory device according to claim 4, wherein the first switch, the second switch, the first memory cell, and the second memory cell have the same structure.

9. The magnetic memory device according to claim 1, further comprising:

a diode which is connected to the second terminal.

10. The magnetic memory device according to claim 1, further comprising:

a transistor which is connected to the second terminal and has diode connection.

11. The magnetic memory device according to claim 1, further comprising:

a current supply circuit which supplies a write current to the selected first memory cell via the first wiring line, wherein the magnetic memory device is configured to increase the third voltage as a position of the selected first memory cell becomes farther from the current supply circuit.

12. The magnetic memory device according to claim 1, wherein the first magnetoresistance effect element includes a first magnetic layer having a variable magnetization direction, a second magnetic layer having a fixed magnetization direction, and a nonmagnetic layer provided between the first magnetic layer and the second magnetic layer.

13. The magnetic memory device according to claim 1, further comprising:

a write circuit which performs a first write operation and a second write operation on the selected first memory cell, wherein the first write operation includes writing first data to the selected first memory cell by setting the first magnetoresistance effect element to the high resistance state, and the second write operation includes writing second data to the selected first memory cell by setting the first magnetoresistance effect element to the low resistance state.

14. The magnetic memory device according to claim 13, wherein the write circuit sets the first switch to an on-state after the first magnetoresistance effect element is set to the high resistance state.

15. The magnetic memory device according to claim 13, wherein the write circuit includes:

a first element which generates a first enable state that enables data to be written to the selected first memory cell;

a second element which generates a second enable state that enables the first switch to be set to an on-state; and a delay circuit which controls the second element so as to generate the second enable state a predetermined time after the first element generates the first enable state.

16. The magnetic memory device according to claim 13, wherein the write circuit includes a current supply circuit which supplies a write current to the selected first memory cell via the first wiring line, and the first wiring line includes a first position at which a distance to the first switch is minimum, a second position at which a distance to the selected first memory cell is minimum, and a third position at which a distance to the current supply circuit is minimum, and the first position is between the second position and the third position.

17. The magnetic memory device according to claim 13, wherein the write circuit applies a fourth voltage to the selected first memory cell such that the first selector of the selected first memory cell is set to an on-state and supplies a write current to the first magnetoresistance effect element of the selected first memory cell, when the first data is written to the selected first memory cell.

18. The magnetic memory device according to claim 17, wherein the write circuit applies a fifth voltage to the first switch when the first data is written to the selected first memory cell, and the fifth voltage is lower than the fourth voltage.

19. The magnetic memory device according to claim 18, wherein
 when the first data is written, the first switch is set to an on-state in a case where the fifth voltage is higher than a predetermined voltage.

20. The magnetic memory device according to claim 19, wherein
 the predetermined voltage is higher than the second voltage.

* * * * *